(12) United States Patent
Zhang et al.

(10) Patent No.: US 11,769,603 B2
(45) Date of Patent: Sep. 26, 2023

(54) H-3 SILICON CARBIDE PN-TYPE RADIOISOTOPIC BATTERY AND MANUFACTURING METHOD OF THE SAME

(71) Applicant: CHANG'AN UNIVERSITY, Xi'an (CN)

(72) Inventors: Lin Zhang, Xi'an (CN); Xiaoyan Wang, Xi'an (CN); Liya Zhu, Xi'an (CN)

(73) Assignee: CHANG'AN UNIVERSITY, Xi'an (CN)

( * ) Notice: Subject to any disclaimer, the term of this patent is extended or adjusted under 35 U.S.C. 154(b) by 363 days.

(21) Appl. No.: 16/962,842

(22) PCT Filed: Dec. 26, 2018

(86) PCT No.: PCT/CN2018/123949
§ 371 (c)(1),
(2) Date: Jul. 17, 2020

(87) PCT Pub. No.: WO2020/087730
PCT Pub. Date: May 7, 2020

(65) Prior Publication Data
US 2021/0090754 A1 Mar. 25, 2021

(30) Foreign Application Priority Data
Oct. 29, 2018 (CN) .......................... 201811269908.7

(51) Int. Cl.
*G21H 1/06* (2006.01)
*H01L 31/0224* (2006.01)
(Continued)

(52) U.S. Cl.
CPC ....... *G21H 1/06* (2013.01); *H01L 31/022408* (2013.01); *H01L 31/0312* (2013.01); *H01L 31/1804* (2013.01)

(58) Field of Classification Search
CPC ............. H02N 1/00; G21H 1/06; H02K 11/24
(Continued)

(56) References Cited

U.S. PATENT DOCUMENTS

| 2011/0241144 A1* | 10/2011 | Spencer ................... G21H 1/02 257/E29.166 |
| 2014/0319963 A1* | 10/2014 | Choi ........................ G21H 1/06 310/303 |
| 2018/0211738 A1 | 7/2018 | Chen |

FOREIGN PATENT DOCUMENTS

| CN | 102522136 A | * | 6/2012 |
| CN | 102522136 A | | 6/2012 |

(Continued)

OTHER PUBLICATIONS

International Search Report (PCT/CN2018/123949), dated Jul. 29, 2019.

*Primary Examiner* — Jose A Gonzalez Quinones
(74) *Attorney, Agent, or Firm* — W&G Law Group

(57) ABSTRACT

The present invention discloses an H-3 silicon carbide PN-type radioisotopic battery and a manufacturing method therefor. The radioisotopic battery has a structure including, from bottom to top, an N-type ohmic contact electrode, an N-type highly doped SiC substrate, an N-type SiC epitaxial layer, and a P-type SiC epitaxial layer. A P-type SiC ohmic contact doped layer is disposed on a partial upper area of the P-type SiC epitaxial layer, a P-type ohmic contact electrode is disposed on top of the P-type SiC ohmic contact doped layer, a $SiO_2$ passivation layer is disposed on an upper area of the P-type SiC epitaxial layer where the P-type ohmic contact doped layer is removed, and an H-3 radioisotope source is provided on the top of the $SiO_2$ passivation layer.

8 Claims, 3 Drawing Sheets

(51) Int. Cl.
*H01L 31/0312* (2006.01)
*H01L 31/18* (2006.01)
*H02K 11/24* (2016.01)
*H02N 1/00* (2006.01)

(58) Field of Classification Search
USPC .............................. 310/303, 363, 365, 366
See application file for complete search history.

(56) References Cited

FOREIGN PATENT DOCUMENTS

| | | | |
|---|---|---|---|
| CN | 103021492 A | | 4/2013 |
| CN | 104392761 A | | 3/2015 |
| CN | 205140531 U | * | 4/2016 |

* cited by examiner

H-3 SILICON CARBIDE PN-TYPE RADIOISOTOPIC BATTERY AND MANUFACTURING METHOD OF THE SAME

CROSS-REFERENCE TO RELATED APPLICATIONS

This is the United States national phase of International Patent Application No. PCT/CN2018/123949, filed on Dec. 26, 2018, which claims priority of Chinese patent application No. 201811269908.7, filed on Oct. 29, 2018, the entire contents of which are incorporated herein by their references.

TECHNICAL FIELD

The present invention relates to the technical field of semiconductor devices and semiconductor processes, and particularly, relates to an H-3 silicon carbide PN-type radioisotopic battery and a manufacturing method thereof.

BACKGROUND

Radioisotopic batteries are energy conversion devices that convert nuclear radiant energy into electrical energy by using a radiant volt effect which is produced in a semiconductor device by charged particles generated by radioactive isotope decay. Among various types of micro energy sources, the radioisotopic batteries are regarded as the most ideal long-term energy source for MEMS systems due to their advantages of high reliability, easy integration, and strong anti-interference. High output power is a prerequisite for micro nuclear batteries to be widely applied in practice. However, the output power of the micro nuclear batteries can hardly be enhanced by increasing the activity of radiation sources for the reasons such as a self-absorption effect and cost of the isotope sources. In order to reach a sufficiently high and long-term stable output power to accelerate their practical application, both the transducing element and the radioactive sources should be optimized.

In terms of the radioactive sources, a low-energy β radioactive source (such as $^{63}$Ni, average particle energy is 17.3 KeV), having a low electron flux density, is commonly used as the energy source. The output power can only be finitely enhanced by simply increasing an intensity of the radioactive source due to the self-absorption effect of the radioactive source. In this regard, it is the focus of current research to enhance the energy conversion efficiency. Among various isotope sources, H-3 (tritium, $^{3}$H) has a long half-life (12.3 years) and high specific activity, and moreover, it is easily available and cheap, being regarded as one of the most ideal energy sources for micro nuclear batteries. H-3 emits low electron energy (5.7 keV), and has a small radiation depth in semiconductor materials (less than 2 μm), and the ionization energy can be easily and sufficiently collected, which in turn determines that its performances are more likely to be affected by factors such as a surface structure and a surface recombination of the transducing element, FIG. 1 illustrates a distribution of ionization energy generated by H-3 in SiC material.

Wide band gap semiconductor materials represented by SiC and GaN have the advantages such as large band gap width and strong radiation resistance. The radioisotopic battery transducing element made of the wide band gap semiconductor materials has a high built-in potential and a small leakage current, and can theoretically obtain higher open circuit voltage and energy conversion efficiency than silicon-based batteries; moreover, it is also able to work for a long time in harsh environments such as high temperature and strong radiation. Compared to SiC Schottky diodes, SiC PN or PIN-type diodes have the advantages of high built-in potential and small leakage current, and the radioisotopic batteries made thereof have the advantages of high open circuit voltage and high conversion efficiency.

However, many problems exist in the current research on silicon carbide PN-type radioisotopic battery using H-3, and the biggest one is how to avoid the recombination loss of irradiation-generated carriers on the device surface. As shown in FIG. 3, H-3 has a shallow electron range, the peak value thereof is close to the device surface, and thus it is difficult to avoid the loss of the irradiation-generated carriers caused by the surface recombination. Due to the high hardness and high chemical stability of the SiC material, its processing technology is far less developed than that of the Si material. Therefore, it is a focus and a difficulty in current research in reducing an influence of the surface recombination on the output characteristics of the micro nuclear batteries.

SUMMARY

In order to solve the above problems, the purposes of the present inventions are to provide an H-3 silicon carbide PN-type radioisotopic battery and a manufacturing method thereof.

For the above purposes, the present invention adopts the following technical solutions.

An H-3 silicon carbide PN-type radioisotopic battery includes an N-type conductive SiC substrate, an N-type SiC epitaxial layer, a P-type SiC epitaxial layer, a $SiO_2$ passivation layer, a P-type SiC ohmic contact doped region, a P-type ohmic contact electrode, an N-type ohmic contact electrode, and an H-3 radioisotope source. The N-type ohmic contact electrode is disposed under the substrate, the N-type SiC epitaxial layer is disposed on the substrate, the P-type SiC epitaxial layer is disposed on the N-type SiC epitaxial layer, the P-type SiC ohmic contact doped region and the $SiO_2$ passivation layer are adjacent to each other and are both disposed on an upper surface of the P-type SiC epitaxial layer, the P-type ohmic contact electrode is disposed right above the P-type SiC ohmic contact doped region, and the H-3 radioisotope source is disposed right above the $SiO_2$ passivation layer.

Further, a total thickness of the N-type SiC epitaxial layer and the P-type SiC epitaxial layer ranges from 0.8 μm to 2.0 μm.

Further, a thickness of the P-type SiC epitaxial layer ranges from 0.05 μm to 0.20 μm.

Further, the P-type SiC epitaxial layer has a doping concentration in a range of $1\times10^{14}$ cm$^{-3}$ to $1\times10^{17}$ cm$^{-3}$.

Further, the N-type SiC epitaxial layer has a doping concentration in a range of $1\times10^{17}$ cm$^{-3}$ to $1\times10^{18}$ cm$^{-3}$.

Further, the P-type SiC ohmic contact doped region has a doping concentration in a range of $5\times10^{18}$ cm$^{-3}$ to $2\times10^{19}$ cm$^{-3}$ and a thickness in a range of 0.20 μm to 0.50 μm.

Further, a thickness of the $SiO_2$ passivation layer ranges from 5 nm to 20 nm.

A manufacturing method for the above H-3 silicon carbide PN-type radioisotopic battery includes the following steps:

Step 1: providing the substrate formed by an N-type doped SiC substrate;

Step 2: epitaxially growing the N-type SiC epitaxial layer on an upper surface of the substrate provided in Step 1 through chemical vapor deposition, the N-type SiC epitaxial layer having a doping concentration of $1\times10^{17}$ cm$^{-3}$ to $1\times10^{18}$ cm$^{-3}$ and a thickness of 0.75 μm to 1.8 μm;

Step 3: epitaxially growing the P-type SiC epitaxial layer on an upper surface of the N-type SiC epitaxial layer through chemical vapor deposition, the P-type SiC epitaxial layer having a doping concentration of $1\times10^{14}$ cm$^{-3}$ to $1\times10^{17}$ cm$^{-3}$ and a thickness of 0.05 μm to 0.20 μm;

Step 4: epitaxially growing the P-type SiC ohmic contact doped region on an upper surface of the P-type SiC epitaxial layer through chemical vapor deposition, the P-type SiC ohmic contact doped region having a doping concentration of $5\times10^{18}$ cm$^{-3}$ to $2\times10^{19}$ cm$^{-3}$ and a thickness of 0.2 μm to 0.5 μm;

Step 5: etching away a part of the P-type SiC ohmic contact doped region through reactive ion etching to expose the P-type SiC epitaxial layer;

Step 6: forming an oxidation layer on a surface of the P-type SiC ohmic contact doped region and a surface of the P-type SiC epitaxial layer through dry-oxygen oxidation, and removing the oxidation layer through wet etching;

Step 7: forming the SiO$_2$ passivation layer on a region of an upper surface of the P-type SiC epitaxial layer outside the P-type SiC ohmic contact doped region, the SiO$_2$ passivation layer having a thickness of 5 nm to 20 nm;

Step 8: sequentially depositing metal Ni with a thickness of 200 nm to 400 nm and metal Pt with a thickness of 100 nm to 200 nm on the P-type SiC ohmic contact doped region;

Step 9: sequentially depositing metal Ni with a thickness of 200 nm to 400 nm and metal Pt with a thickness of 100 nm to 200 nm under the substrate;

Step 10: performing thermal annealing under N$_2$ atmosphere at a temperature of 950° C. to 1050° C. for 2 minutes to form the P-type ohmic contact electrode on the P-type SiC ohmic contact doped region and to form the N-type ohmic contact electrode under the substrate; and Step 11: providing the H-3 radioisotope source on a top of the SiO$_2$ passivation layer.

Compared with the prior art, the present inventions have the following technical effects:

In the H-3 silicon carbide PN-type radioisotopic battery according to the present invention, a new transducing element is used to replace the conventional PIN junction or PN junction, such that the surface recombination e is reduced through reduction the doping concentration of the device surface, which is conducive to reducing recombination loss of irradiation-generated carriers on the surface, thereby increasing the output power of the battery.

A high built-in potential barrier of the battery of the present invention can bring a high open circuit voltage, thereby reaching a high conversion efficiency. Moreover, because of the shallow electron range of H-3, the irradiation-generated carriers should be collected as much as by a depletion region rather than a diffusion region. As a high built-in barrier and a wide depletion region are contradictory to each other, it brings difficulties to the design of the battery. By adopting the structure of the transducing element proposed by the present invention, both a high build-in potential barrier and a thicker depletion region can be achieved, thereby improving the performance of the battery.

The manufacturing method of present invention has a simple process, is easy to implement, and has low cost.

The design of present invention is novel and rational, easy to implement, conducive to improving the energy conversion efficiency and an encapsulating density of H-3 silicon carbide PN-type radioisotopic battery, and also conducive to integration, and has strong practicability and high application value.

REFERENCE SIGNS IN FIGURES

1—N-type doped SiC substrate; 2—N-type SiC epitaxial layer; 3—P-type SiC epitaxial layer; 4—SiO$_2$ passivation layer; 5—P-type SiC ohmic contact doped region; 6—P-type ohmic contact electrode; 7—N-type ohmic contact electrode; and 8—H-3 radioisotope source.

DESCRIPTION OF EMBODIMENTS

The present inventions are further described with reference to the drawings.

Figure 1:
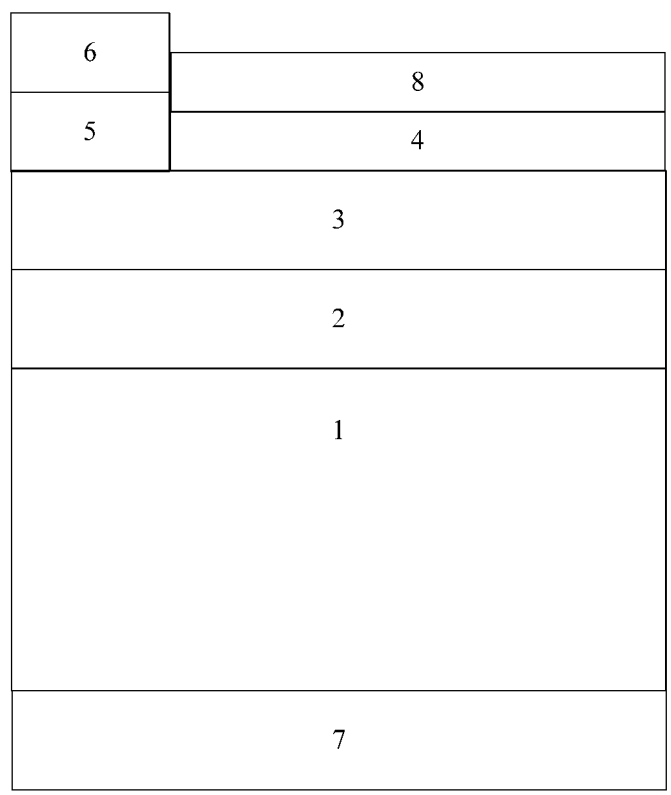
FIG. 1 is a front view of an H-3 silicon carbide PN-type radioisotopic battery according to the present invention.
Figure 2:
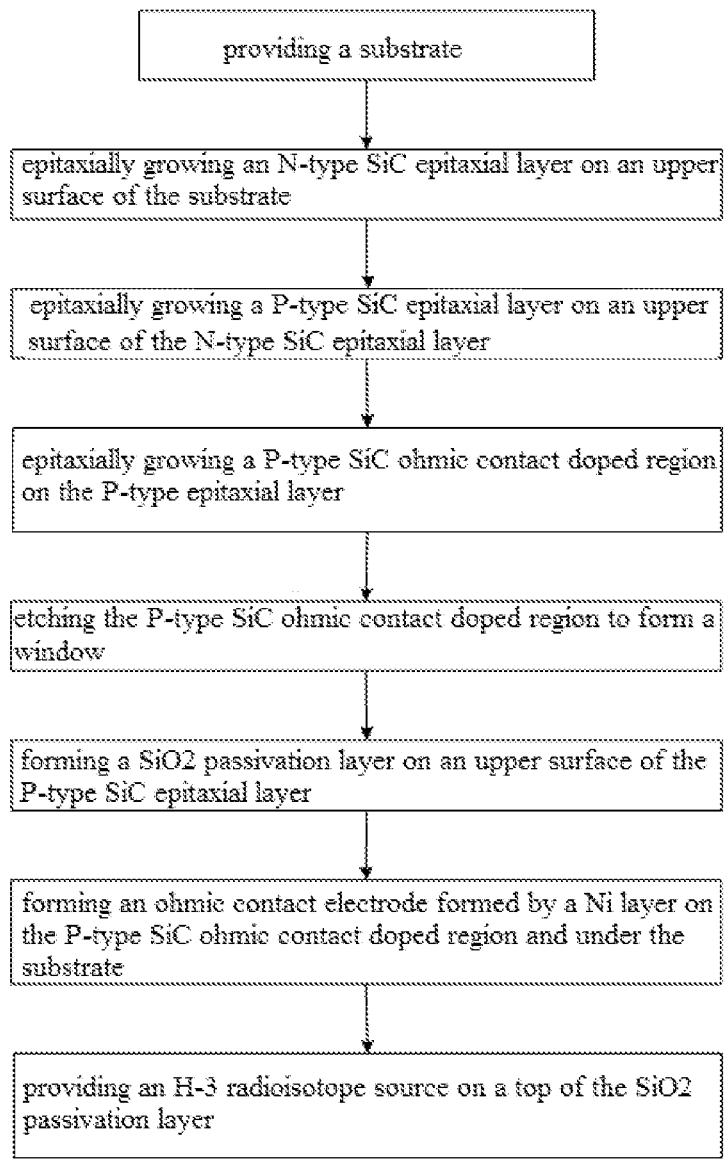
FIG. 2 is a flow diagram of a manufacturing method of an H-3 silicon carbide PN-type radioisotopic battery according to the present invention.
Figure 3:
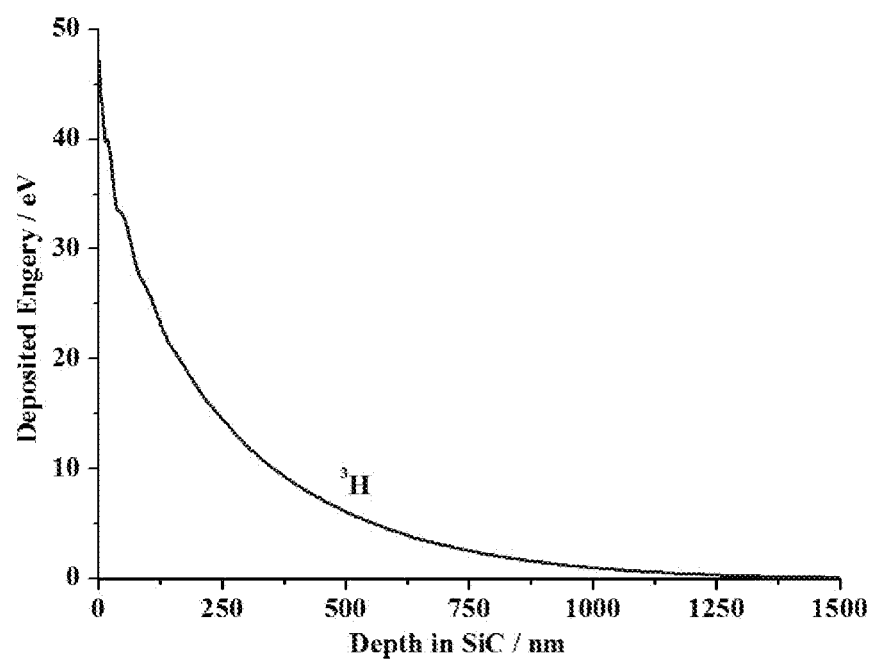
FIG. 3 is a diagram of the prior art.

Referring to FIG. 1 and FIG. 2, an H-3 silicon carbide PN-type radioisotopic battery includes an N-type conductive SiC substrate 1, an N-type SiC epitaxial layer 2, a P-type SiC epitaxial layer 3, a SiO$_2$ passivation layer 4, a P-type SiC ohmic contact doped region 5, a P-type ohmic contact electrode 6, an N-type ohmic contact electrode 7, and an H-3 radioisotope source 8. The N-type ohmic contact electrode 7 is disposed under the substrate 1, the N-type SiC epitaxial layer 2 is disposed on the substrate, the P-type SiC epitaxial layer 3 is disposed on the N-type SiC epitaxial layer 2, the P-type SiC ohmic contact doped region 5 and the SiO$_2$ passivation layer 4 are adjacent to each other and are both disposed on an upper surface of the P-type SiC epitaxial layer 3, the P-type ohmic contact electrode 6 is disposed right above the P-type SiC ohmic contact doped region 5, and the H-3 radioisotope source 8 is disposed right above the SiO$_2$ passivation layer 4.

A total thickness of the N-type SiC epitaxial layer 2 and the P-type SiC epitaxial layer 3 ranges from 0.8 μm to 2.0 μm.

A thickness of the P-type SiC epitaxial layer 3 ranges from 0.05 μm to 0.20 μm.

The P-type SiC epitaxial layer 3 has a doping concentration in a range of $1\times10^{14}$ cm$^{-3}$ to $1\times10^{17}$ cm$^{-3}$. The thickness of the P-type SiC epitaxial layer 3 is decreased with the increase of the concentration of the P-type SiC epitaxial layer 3, and the thickness of the P-type SiC epitaxial layer 3 is increased with a decrease of the concentration of the P-type SiC epitaxial layer 3.

The N-type SiC epitaxial layer 2 has a doping concentration in a range of $1\times10^{17}$ cm$^{-3}$ to $1\times10^{18}$ cm$^{-3}$. The thickness of the N-type SiC epitaxial layer 2 is decreased with an increase of the concentration of the N-type SiC epitaxial layer 2.

The P-type SiC ohmic contact doped region 5 has a doping concentration in a range of $5\times10^{18}$ cm$^{-3}$ to $2\times10^{19}$ cm$^{-3}$ and a thickness in a range of 0.20 μm to 0.50 μm.

A thickness of the SiO$_2$ passivation layer 4 ranges from 5 nm to 20 nm.

A manufacturing method for the H-3 silicon carbide PN-type radioisotopic battery includes the following steps:

Step 1: providing the substrate 1 formed by an N-type doped SiC substrate;

Step 2: epitaxially growing the N-type SiC epitaxial layer 2 on an upper surface of the substrate provided in Step 1 through chemical vapor deposition, the N-type SiC epitaxial layer 2 having a doping concentration of $1\times10^{17}$ cm$^{-3}$ to $1\times10^{18}$ cm$^{-3}$ and a thickness of 0.75 μm to 1.8 μm;

Step 3: epitaxially growing the P-type SiC epitaxial layer 3 on an upper surface of the N-type SiC epitaxial layer 2 through chemical vapor deposition, the P-type SiC epitaxial layer 3 having a doping concentration of $1\times10^{14}$ cm$^{-3}$ to $1\times10^{17}$ cm$^{-3}$ and a thickness of 0.05 μm to 0.20 μm;

Step 4: epitaxially growing the P-type SiC ohmic contact doped region 5 on an upper surface of the P-type SiC epitaxial layer 3 through chemical vapor deposition, the P-type SiC ohmic contact doped region 5 having a doping concentration of $5\times10^{18}$ cm$^{-3}$ to $2\times10^{19}$ cm$^{-3}$ and a thickness of 0.2 μm to 0.5 μm;

Step 5: etching away a part of the P-type SiC ohmic contact doped region 5 through reactive ion etching to expose the P-type SiC epitaxial layer 3;

Step 6: forming an oxidation layer on a surface of the P-type SiC ohmic contact doped region 5 and a surface of the P-type SiC epitaxial layer 3 through dry-oxygen oxidation, and removing the oxidation layer through wet etching;

Step 7: forming the SiO$_2$ passivation layer 4 on a region of an upper surface of the P-type SiC epitaxial layer 3 outside the P-type SiC ohmic contact doped region 5 through dry-oxygen oxidation, the SiO$_2$ passivation layer 4 having a thickness of 5 nm to 20 nm;

Step 8: sequentially depositing metal Ni with a thickness of 200 nm to 400 nm and metal Pt with a thickness of 100 nm to 200 nm on the P-type SiC ohmic contact doped region 5;

Step 9: sequentially depositing metal Ni with a thickness of 200 nm to 400 nm and metal Pt with a thickness of 100 nm to 200 nm under the substrate 1;

Step 10: performing thermal annealing under N$_2$ atmosphere at a temperature of 950° C. to 1050° C. for 2 minutes to form the P-type ohmic contact electrode 6 on the P-type SiC ohmic contact doped region. 5 and to form the N-type ohmic contact electrode 7 under the substrate 1; and Step 11: providing the H-3 radioisotope source 8 on a top of the SiO$_2$ passivation layer 4.

EXAMPLE 1

A manufacturing method of an H-3 silicon carbide PN-type radioisotopic battery includes the following steps:

Step 1: providing a substrate 1 formed by an N-type doped SiC substrate;

Step 2: epitaxially growing an N-type SiC epitaxial layer 2 on an upper surface of the substrate provided in Step 1 through chemical vapor deposition, the N-type SiC epitaxial layer 2 having a doping concentration of $4\times10^{17}$ cm$^{-3}$ and a thickness of 1.8 μm;

Step 3: epitaxially growing a P-type SiC epitaxial layer 3 on an upper surface of the N-type SiC epitaxial layer 2 through chemical vapor deposition, the P-type SiC epitaxial layer 3 having a doping concentration of $3\times10^{16}$ cm$^{-3}$ and a thickness of 0.10 μm;

Step 4: epitaxially growing a P-type SiC ohmic contact doped region 5 on an upper surface of the P-type SiC epitaxial layer 3 through chemical vapor deposition, the P-type SiC ohmic contact doped region 5 having a doping concentration of $1\times10^{19}$ cm$^{-3}$ and a thickness of 0.2 μm;

Step 5: etching away a part of the P-type SiC ohmic contact doped region 5 through reactive ion etching to expose the P-type SiC epitaxial layer 3;

Step 6: forming an oxidation layer on a surface of the P-type SiC ohmic contact doped region 5 and a surface of the P-type SiC epitaxial layer 3 through dry-oxygen oxidation, and removing the oxidation layer through wet etching;

Step 7: forming a SiO$_2$ passivation layer 4 on a region of an upper surface of the P-type SiC epitaxial layer 3 outside the P-type SiC ohmic contact doped region 5, the SiO$_2$ passivation layer 4 having a thickness of 10 nm;

Step 8: sequentially depositing metal Ni with a thickness of 400 nm and metal Pt with a thickness of 200 nm on the P-type SiC ohmic contact doped region 5;

Step 9: sequentially depositing metal Ni with a thickness of 400 nm and metal Pt with a thickness of 200 nm under the substrate 1;

Step 10: performing thermal annealing under N$_2$ atmosphere at a temperature of 1000° C. for 2 minutes to form a P-type ohmic contact electrode 6 on the P-type SiC ohmic contact doped region 5 and to form an N-type ohmic contact electrode 7 under the substrate 1; and Step 11: providing an H-3 radioisotope source 8 on a top of the SiO$_2$ passivation layer 4.

What is claimed is:

1. An H-3 silicon carbide PN-type radioisotopic battery, comprising:
    an N-type conductive SiC substrate;
    an N-type SiC epitaxial layer;
    a P-type SiC epitaxial layer;
    a SiO$_2$ passivation layer;
    a P-type SiC ohmic contact doped region;
    a P-type ohmic contact electrode;
    an N-type ohmic contact electrode; and
    an H-3 radioisotope source,
    wherein the N-type ohmic contact electrode is disposed under the substrate, the N-type SiC epitaxial layer is disposed on the substrate, the P-type SiC epitaxial layer is disposed on the N-type SiC epitaxial layer, the P-type SiC ohmic contact doped region and the SiO$_2$ passivation layer are adjacent to each other and are both disposed on an upper surface of the P-type SiC epitaxial layer, the P-type ohmic contact electrode is disposed right above the P-type SiC ohmic contact doped region, and the H-3 radioisotope source is disposed right above the SiO$_2$ passivation layer.

2. The H-3 silicon carbide PN-type radioisotopic battery according to claim 1, wherein a total thickness of the N-type SiC epitaxial layer and the P-type SiC epitaxial layer ranges from 0.8 μm to 2.0 μm.

3. The H-3 silicon carbide PN-type radioisotopic battery according to claim 1, wherein a thickness of the P-type SiC epitaxial layer ranges from 0.05 μm to 0.20 μm.

4. The H-3 silicon carbide PN-type radioisotopic battery according to claim 3, wherein the P-type SiC epitaxial layer has a doping concentration in a range of $1\times10^{14}$ cm$^{-3}$ to $1\times10^{17}$ cm$^{-3}$.

5. The H-3 silicon carbide PN-type radioisotopic battery according to claim 2, wherein the N-type SiC epitaxial layer has a doping concentration in a range of $1\times10^{17}$ cm$^{-3}$ to $1\times10^{18}$ cm$^{-3}$.

6. The H-3 silicon carbide PN-type radioisotopic battery according to claim 1, wherein the P-type SiC ohmic contact doped region has a doping concentration in a range of $5\times10^{18}$ cm$^{-3}$ to $2\times10^{19}$ cm$^{-3}$ and a thickness in a range of 0.20 μm to 0.50 μm.

7. The H-3 silicon carbide PN-type radioisotopic battery according to claim 1, wherein a thickness of the $SiO_2$ passivation layer ranges from 5 nm to 20 nm.

8. A manufacturing method for the H-3 silicon carbide PN-type radioisotopic battery according to claim 1, comprising:

Step 1: providing the substrate formed by an N-type doped SiC substrate;

Step 2: epitaxially growing the N-type SiC epitaxial layer on an upper surface of the substrate provided in Step 1 through chemical vapor deposition, wherein the N-type SiC epitaxial layer has a doping concentration of $1\times10^{17}$ cm$^{-3}$ to $1\times10^{18}$ cm$^{-3}$ and a thickness of 0.75 μm to 1.8 μm;

Step 3: epitaxially growing the P-type SiC epitaxial layer on an upper surface of the N-type SiC epitaxial layer through chemical vapor deposition, wherein the P-type SiC epitaxial layer has a doping concentration of $1\times10^{14}$ cm$^{-3}$ to $1\times10^{17}$ cm$^{-3}$ and a thickness of 0.05 μm to 0.20 μm;

Step 4: epitaxially growing the P-type SiC ohmic contact doped region on an upper surface of the P-type SiC epitaxial layer through chemical vapor deposition, wherein the P-type SiC ohmic contact doped region has a doping concentration of $5\times10^{18}$ cm$^{-3}$ to $2\times10^{19}$ cm$^{-3}$ and a thickness of 0.2 μm to 0.5 μm;

Step 5: etching away a part of the P-type SiC ohmic contact doped region through reactive ion etching to expose the P-type SiC epitaxial layer;

Step 6: forming an oxidation layer on a surface of the P-type SiC ohmic contact doped region and a surface of the P-type SiC epitaxial layer through dry-oxygen oxidation, and removing the oxidation layer through wet etching;

Step 7: forming the $SiO_2$ passivation layer on a region of an upper surface of the P-type SiC epitaxial layer outside the P-type SiC ohmic contact doped region through dry-oxygen oxidation, wherein the $SiO_2$ passivation layer has a thickness of 5 nm to 20 nm;

Step 8: sequentially depositing metal Ni with a thickness of 200 nm to 400 nm and metal Pt with a thickness of 100 nm to 200 nm on the P-type SiC ohmic contact doped region;

Step 9: sequentially depositing metal Ni with a thickness of 200 nm to 400 nm and metal Pt with a thickness of 100 to 200 nm under the substrate;

Step 10: performing thermal annealing under $N_2$ atmosphere at a temperature of 950° C. to 1050° C. for 2 minutes to form the P-type ohmic contact electrode on the P-type SiC ohmic contact doped region and to form the N-type ohmic contact electrode under the substrate; and Step 11: providing the H-3 radioisotope source on a top of the $SiO_2$ passivation layer.

* * * * *